(12) United States Patent
Devitt (10) Patent No.: US 7,394,076 B2
(45) Date of Patent: Jul. 1, 2008

(54) MOVING VACUUM CHAMBER STAGE WITH AIR BEARING AND DIFFERENTIALLY PUMPED GROOVES (75) Inventor: Andrew J. Devitt, Media, PA (US)

(73) Assignee: New Way Machine Components, Inc., Aston, PA (US)

( * ) Notice: Subject to any disclaimer, the term of this patent is extended or adjusted under 35 U.S.C. 154(b) by 212 days.

(21) Appl. No.: 11/206,296

(22) Filed: Aug. 18, 2005

(65) Prior Publication Data

US 2006/0060259 A1 Mar. 23, 2006

Related U.S. Application Data (60) Provisional application No. 60/697,973, filed on Jul. 12, 2005, provisional application No. 60/602,339, filed on Aug. 18, 2004.

(51) Int. Cl.
G01F 23/00 (2006.01)

(52) U.S. Cl. ............... 250/441.11; 250/307; 250/442.11

(58) Field of Classification Search ................... 141/65; 250/441.11
See application file for complete search history.

(56) References Cited

U.S. PATENT DOCUMENTS

| 4,191,385 | A |   | 3/1980  | Fox              |         |
|-----------|---|---|---------|------------------|---------|
| 4,538,885 | A | * | 9/1985  | Graham et al.    | 359/393 |
| 4,726,689 | A |   | 2/1988  | Pollock          |         |
| 4,749,283 | A |   | 6/1988  | Yokomatsu et al. |         |
| 5,013,384 | A |   | 5/1991  | Mellink et al.   |         |
| 5,558,717 | A |   | 9/1996  | Zhao et al.      |         |
| 5,730,801 | A |   | 3/1998  | Tepman et al.    |         |
| 5,898,179 | A |   | 4/1999  | Smick            |         |
| 5,997,963 | A |   | 12/1999 | Davison          |         |
| 6,126,169 | A |   | 10/2000 | Sogard et al.    |         |
| 6,172,372 | B1 |  | 1/2001  | Vanderpot        |         |
| 6,271,530 | B1 | * | 8/2001 | Smick et al.     | 250/492.21 |
| 6,274,875 | B1 | * | 8/2001 | Smick et al.     | 250/492.21 |
| 6,323,496 | B1 | * | 11/2001| Sakase et al.    | 250/492.21 |
| 6,328,473 | B1 |  | 12/2001 | Tokushima et al. |         |
| 6,350,991 | B1 |  | 2/2002  | Ryding           |         |
| 6,443,618 | B1 |  | 9/2002  | Nishikawa et al. |         |
| 6,445,440 | B1 |  | 9/2002  | Bisschops et al. |         |

(Continued)

FOREIGN PATENT DOCUMENTS

EP 1350997 10/2003

(Continued)

Primary Examiner—Jack I. Berman
Assistant Examiner—Andrew Smyth
(74) Attorney, Agent, or Firm—Blank Rome LLP (57) ABSTRACT A stage for processing a substrate, especially useful for vacuum applications, has a recess just large enough to hold a substantially flat substrate and a chuck or holder but not much more. The perimeter of the recessed side has an air bearing surface separated from the recess by differentially pumped groves and seal lands. The air bearing lands are urged against a reference plate guide surface and the seal lands being substantially coplanar create a resistance to flow between the groves and recess, on the other side of the base reference plate mounts the radiation source. The VCS may operate in a vacuum environment itself, or in another preferred embodiment, it provides the possibility for multiple stages moving between process or inspection steps within the same tool or process sequence.

35 Claims, 8 Drawing Sheets

U.S. PATENT DOCUMENTS

| | | |
|---|---|---|
| 6,467,960 B1 | 10/2002 | Watson et al. |
| 6,491,435 B1 | 12/2002 | Nishikawa et al. |
| 6,499,880 B2 | 12/2002 | Tosuda |
| 6,515,288 B1 * | 2/2003 | Ryding et al. ........... 250/441.11 |
| 6,551,404 B2 | 4/2003 | Snijders et al. |
| 6,573,511 B2 | 6/2003 | Sasaki et al. |
| 6,597,429 B2 | 7/2003 | Janssen et al. |
| 6,597,433 B1 | 7/2003 | Renkens et al. |
| 6,603,130 B1 | 8/2003 | Bisschops |
| 6,618,122 B2 | 9/2003 | Bisschops et al. |
| 6,707,530 B2 | 3/2004 | Schrijver et al. |
| 6,710,354 B1 * | 3/2004 | Koch et al. ............. 250/441.11 |
| 6,732,610 B2 * | 5/2004 | Higuchi et al. ........... 74/490.09 |
| 6,734,439 B2 | 5/2004 | Weed et al. |
| 6,747,731 B2 | 6/2004 | Janssen et al. |
| 6,747,732 B1 | 6/2004 | Lee |
| 6,764,386 B2 | 7/2004 | Uziel |
| 6,765,219 B2 | 7/2004 | Berrian et al. |
| 6,774,374 B1 | 8/2004 | Driessen |
| 6,781,684 B1 | 8/2004 | Ekhoff |
| 6,810,297 B2 | 10/2004 | Adin et al. |
| 6,861,614 B1 * | 3/2005 | Tanabe et al. ........... 219/121.66 |
| 6,899,765 B2 | 5/2005 | Krivts et al. |
| 6,932,873 B2 | 8/2005 | Rechav et al. |
| 7,288,774 B1 * | 10/2007 | Koch et al. ............. 250/441.11 |
| 2001/0027595 A1 | 10/2001 | Saiki |
| 2002/0000029 A1 | 1/2002 | Emoto |
| 2002/0021425 A1 | 2/2002 | Janssen et al. |
| 2002/0046707 A1 | 4/2002 | Bilberger et al. |
| 2002/0163630 A1 | 11/2002 | Bosschops et al. |
| 2002/0176061 A1 | 11/2002 | Sai |
| 2002/0179850 A1 | 12/2002 | Novak et al. |
| 2002/0180946 A1 | 12/2002 | Bisschops et al. |
| 2003/0068215 A1 | 4/2003 | Mori et al. |
| 2003/0098960 A1 | 5/2003 | Schneider et al. |
| 2003/0140470 A1 | 7/2003 | Partosa et al. |
| 2003/0185715 A1 | 10/2003 | Krivts et al. |
| 2004/0187791 A1 | 9/2004 | Busse et al. |
| 2004/0187792 A1 | 9/2004 | Parks |
| 2006/0054774 A1 | 3/2006 | Yassour et al. |

FOREIGN PATENT DOCUMENTS

| | | |
|---|---|---|
| WO | WO-82/02235 | 7/1982 |
| WO | WO-99/57331 | 11/1999 |

* cited by examiner

MOVING VACUUM CHAMBER STAGE WITH AIR BEARING AND DIFFERENTIALLY PUMPED GROOVES

REFERENCE TO RELATED APPLICATIONS

The present application claims the benefit of U.S. Provisional Patent Application No. 60/602,339, filed Aug. 18, 2004, and U.S. Provisional Patent Application No. 60/697,973, filed Jul. 12, 2005, whose disclosures are hereby incorporated by reference in their entireties into the present disclosure.

FIELD OF THE INVENTION

This invention relates generally to equipment used in the manufacturing of semiconductor devices and masks and more particularly to equipment used in vacuum processes. Applications are anticipated in areas including, but not limited to, ion implant and milling, deposition, etch, ash, clean, lithography and inspection.

DESCRIPTION OF RELATED ART

Because of the shrinking feature sizes in semiconductor wafers, greater degrees of precision are required in the stages used to provide the necessary motions. Because air-bearing stages allow for higher precision, they are commonly used to pattern and inspect semiconductor wafers. A point has been reached where optical techniques are limiting because of the width of the wavelength of light. Deep UV and even electronic beam processing will be required because of their shorter wavelength. The same or higher degree of precision is required in these processes, but they also require a vacuum environment. There are technical difficulties in attempting to use air-bearing stages in vacuum, as the escaping air increases the pressure in the vacuum chamber.

Many techniques have been employed to effect motion inside a vacuum chamber. Use of rolling element or plane bearing technology has been used, but it is difficult to achieve the required precision. Air bearing systems with differentially pumped scavenge grooves have been employed inside a vacuum chamber. The difficulty here is that the stages quickly become very large to provide the required travels, necessitating large vacuum chambers, and because there is so much scavenging groove perimeter, it is difficult to achieve the low pressures required in the chamber. Another complicating factor in both these methods is that drives, encoders and services all have to be contained inside the vacuum chamber, causing problems with particulation and out gassing.

Methods to keep the mechanization outside of the vacuum chamber have been employed. These include linear and rotary contact seals, rotary ferro fluidic seals, expanding and contracting bellows. Also used are air bearings structures separated from the vacuum chamber by integral differentially pumped grooves that support some sort of a moving member through an aperture in the vacuum chamber wall. (Note U.S. Pat. No. 4,726,689 February 1988 Pollack, Varian; U.S. Pat. No. 5,898,179 April, 1999 Smick, Applied Materials; U.S. Pat. No. 6,515,288 February, 2003 Ryding, Applied Materials) have been tried and are the current state of the Art in ion implantation. However, the above-noted problems with the prior art have not all been successfully overcome.

SUMMARY OF THE INVENTION

It is therefore an object of the invention to overcome the above-noted problems of the prior art.

To achieve the above and other objects, an important design feature in this invention is that instead of trying to build a stage inside a vacuum chamber or reach through a chamber wall, the stage itself becomes the vacuum chamber. Such a stage is called a vacuum chamber stage (VCS). By having the primary or only vacuum chamber completely contained inside the moving stage, all motion systems can exist outside of the vacuum. Because the vacuum chamber size can be reduced to little more than the volume of the substrate, the vacuum pumping requirements and pump down times are dramatically reduced, and the requirement for a large conventional vacuum chamber is eliminated. At the same time, the structural loop between the source and the substrate, say a wafer, is dramatically shortened and stiffened. The stage is guided by its topside, which runs directly on the underside of the base reference member to which the optics, ion source or electron source would mount. Guidance of the stage in the plane established by the X and Y-axis is achieved with an annular air bearing separated from the vacuum section of the stage by differentially pumped groves. This type of stage would be very appropriate for electron beam writing or inspection, Deep UV lithography or ion implantation. This stage architecture may also be useful for many non-vacuum processes because of improvements in the structural loop.

BRIEF DESCRIPTION OF THE DRAWINGS

Preferred embodiments of the present invention will be set forth in detail with reference to the drawings, in which.

DETAILED DESCRIPTION OF THE PREFERRED EMBODIMENTS

Preferred embodiments of the present invention will now be set forth in detail with reference to the drawings.

Figure 1A:
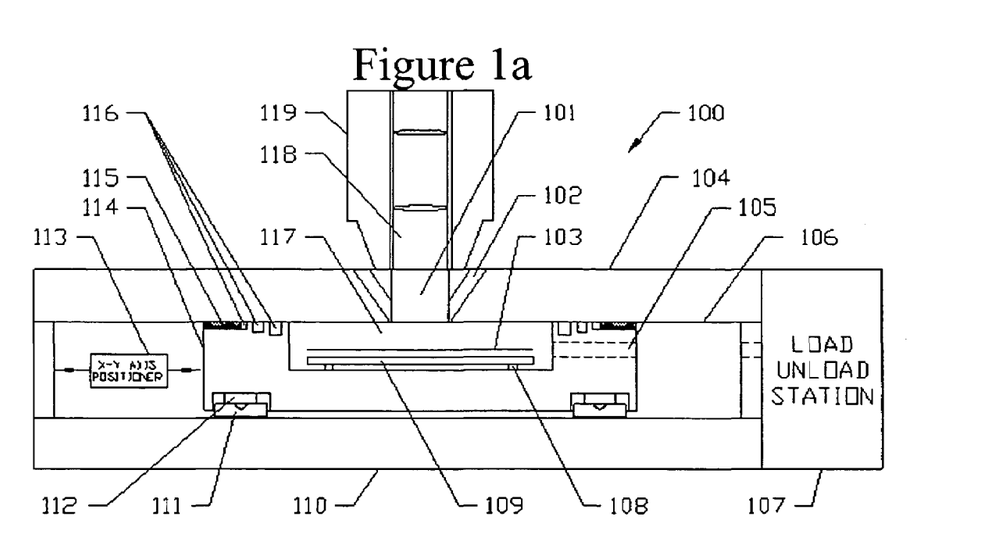
FIGS. 1a-1c show a first preferred embodiment.

FIG. 1a is a side view sectional schematic of a vacuum chamber stage 100 used for precision positioning of the semiconductor wafer or substrate 103 while the substrate is maintained in a vacuum chamber 117. The object of the apparatus is to expose the substrate to some sort of a manufacturing, processing or inspection for the purpose of manufacturing microelectronics circuits there on. Typically the substrate is exposed to some sort of radiation; examples of the many species of radiation would include but are not limited to Ions, x-rays, ultraviolet or extreme ultraviolet, electron beams, DUV (deep ultraviolet), extreme ultraviolet (soft x-rays) and visible light. Often this radiation needs to be conditioned by such devices as analyzers, magnets, mirrors or optics. This conditioning of radiation in this illustration is provided for in the area indicated by 119. This conditioning assembly is connected directly to the base reference member 104 with its output aperture 118 aligned with a consummate aperture 101 in the first reference plate 104.

Vacuum ports 225 for high vacuum conductance can be arrayed around the aperture 202 and connected on the opposite side of the base reference plate 206 to a manifold 203 connected to a cryopump or other low-pressure device. This arrangement allows for excellent conductance of pressure away from the area of interest. The ports may breakthrough into the wall of the aperture as in 102, or they may be completely through base reference plate 206 and arrayed around the aperture 202, as in FIG. 2a. Alternatively, or in addition, ports 102 could be used for directing radiation on an angle rather than normal to the surface of the substrate 103 with appropriate detectors arranged as needed, as for example is often the case in thin film measuring (ex. scatterometry and ellipsometry). The first reference plate 104 may be made from hard coated or nickel coated aluminum, nickel coated steel or stainless steel. Other materials such as ceramics or carbon fiber could also be considered. Important considerations are that the material be vacuum compatible, and the undersurface 106 may be made suitably flat to be used as an air bearing surface, and that the material have the structural strength to withstand the significant atmospheric pressures that may be applied to it without experiencing unaccepted distortions. The first reference plate 104 is shown as a simple plate for simplicity. It could easily be designed with structural ribs on the back; these ribs could also couple to additional mounting points for the radiation conditioning device providing a stiffer, firmer mount than the flange mount shown for simplicity. Avoiding distortions from atmospheric pressures is not a trivial issue; thousands of pounds of force will be equally distributed across a face of the vacuum chamber which will move around on the base reference plate. It is important that the reference base plate 104 remain flat because the smaller the air gap that can be used in the air bearing without contact the more efficient the lands between the differentially pumped grooves become. Engineering techniques for calculating and modeling these forces, including finite element analysis, are well-known in the art and need not be repeated here.

Figure 1B:
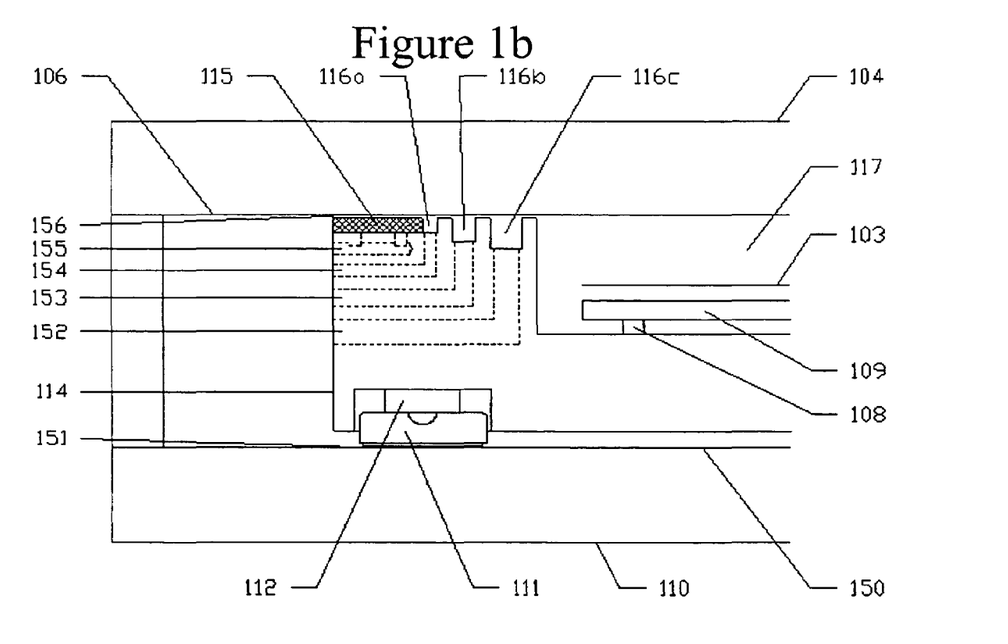

The vacuum chamber stage 114 with air bearing 115 and differentially vacuum pumped grooves 116 is urged against the lower surface 106 of the first reference plate 104 by thousands of pounds of atmospheric pressure. As air bearing surfaces 115 on the vacuum chamber stage 114 come within a thousandth of an inch of the reference base plate surface 106, pressure builds up in the gap 156 between them until equilibrium is reached. The stage then rides on this pressurized film of air, using atmospheric pressure as a preload force to create a very stiff, well damped air bearing free to translate in X, Y and theta. As with the first reference base plate 104, it is important that the vacuum chamber stage 114 have the requisite stiffness not to deform from the thousands of pounds of atmospheric pressure urging it toward the reference plate 104. The air bearing surface 115 in this preferred embodiment employs porous media compensation. Other air bearing compensation may be employed including but not limited to orifice and step compensation. Air bearings are a widely accepted art, much has been written about orifice and porous type air bearings, for porous media air bearings (see FIG. 1b). Porous media air bearings are most commonly made from porous carbon or graphite but may be made from porous alumina or silicon carbide. Carbon and graphite have excellent crash resistance and are very tolerant of inadvertent bearing face contact. Differentially pumped grooves are also well known in the art and are illustrated in FIG. 1b. Notice that in this preferred embodiment the grooves get wider and deeper progressively with lower air pressures. This is consistent with minimizing restriction and maximizing conductance of pressure away from the air bearing land areas.

Figure 1C:
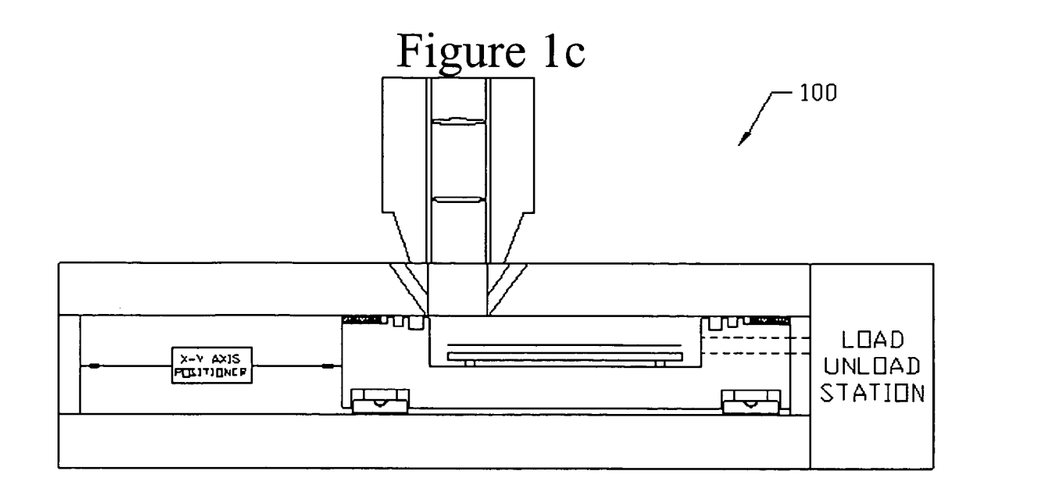

This embodiment can be arranged so as to make it relatively simple to get a wafer 103 in and out of the vacuum chamber stage 114. A 25 mm×325 mm aperture 105 can be arranged in the side of a vacuum chamber stage 114, the vacuum chamber stage 114 can be physically docked against the load-unload station 107 see FIGS. 1c and 2c for the passing of wafers 103 in and out of the chamber without the introduction of atmospheric pressure to the chamber. Commercially available, but not shown, vacuum gates will be required.

By allowing for X and Y motions in a single plane it becomes convenient to use reference mirrors in the plane of the wafer and to drive the vacuum chamber stage through its center of mass. It is also possible to use reaction masses and service stages to improve the stage performance.

It is not necessary but it would be wise to provide another mechanism to urge the vacuum chamber stage 114 against the first reference plate 104. In the event that the vacuum chamber stage 114 loses the vacuum in the chamber 117, gravity would separate the vacuum chamber stage 114 from the first reference plate 106. This would result in a temporary unrecoverable situation. To avoid this situation, air bearings 111 acting upon a second reference plate or base 110 can be employed to urge the vacuum chamber stage 114 against the first reference plate 104 through a constant force springs mechanism 112.

The chuck 109 may be an electrostatic chuck or another chuck technology appropriate for vacuum. The chuck 109 may be mounted on a Z actuator or lifter mechanism 108 for the purpose of raising or lowering the substrate 103 in the VCS, for instance to facilitate substrate changes or to achieve a depth of field adjustment or fine planerization of the substrate. Many techniques known in the art are possible including piezos, super Z's, flexures or other mechanical lifters.

Figure 2A:
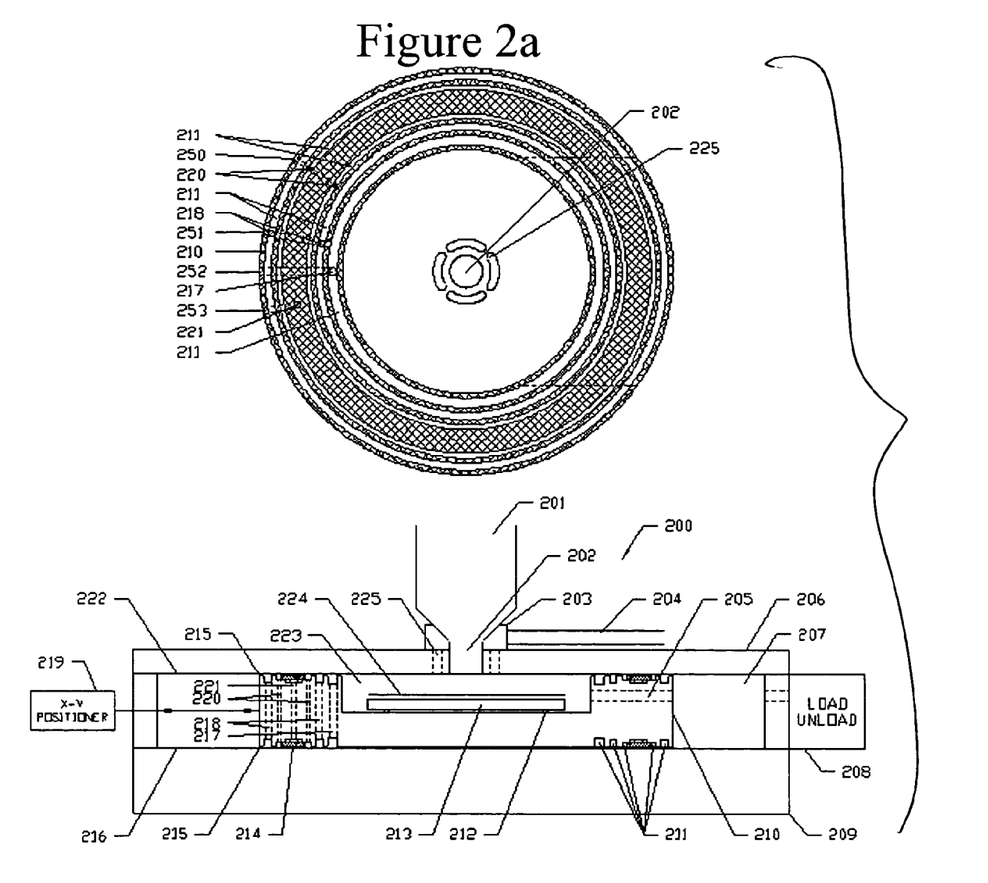
FIGS. 2a-2c show a second preferred embodiment.
Figure 2B:
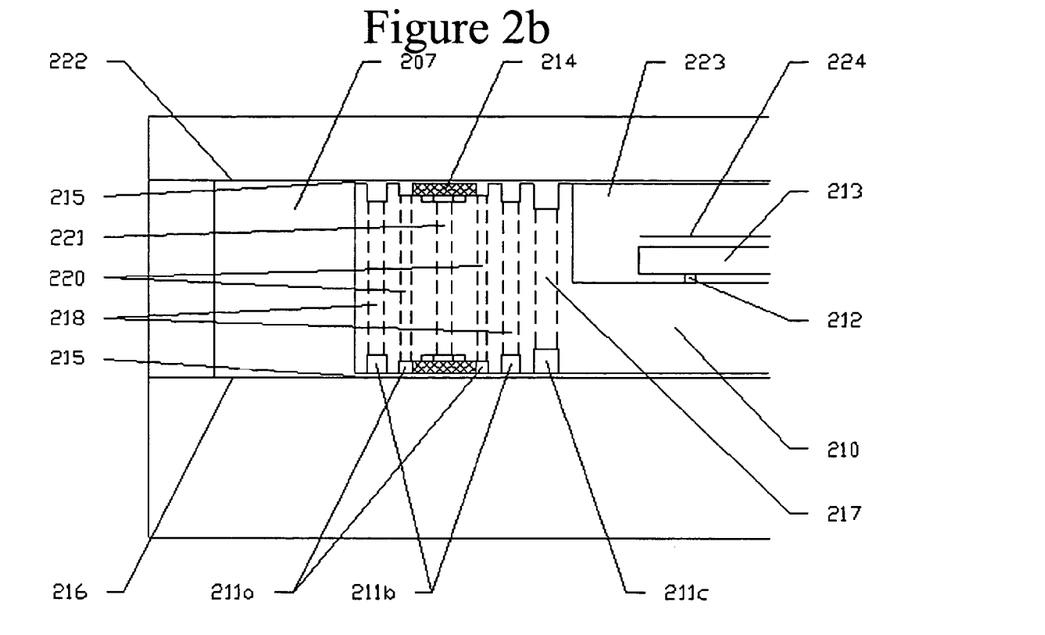
Figure 2C:
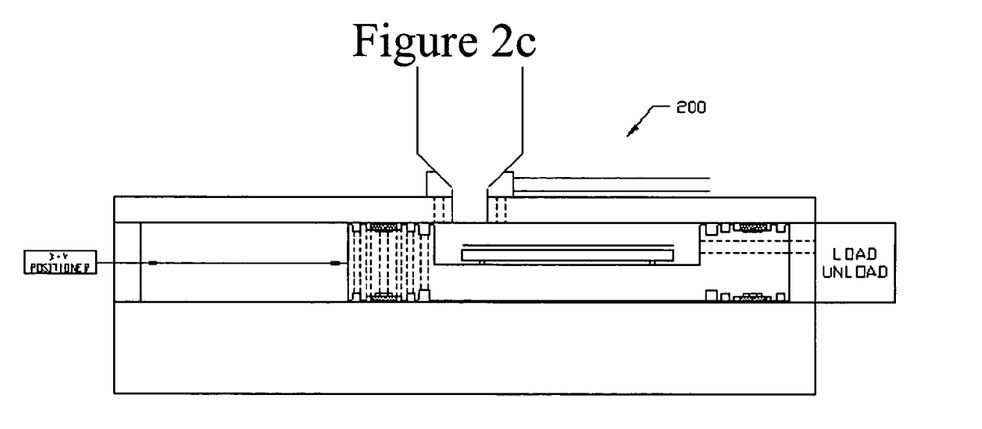

FIG. 2a shows a side view sectional view of a second preferred embodiment. This embodiment allows for the VCS 210 to contain an isolated vacuum chamber 223 as before but also operate in a vacuum 207. This can be a important feature minimizing problems which could occur regarding water vapor adhering to the first 222 or second 216 reference surfaces while the VCS is not over that area. This is accomplished by repeating the air bearing 214 and differentially pumped grooves 211 on the underside of the vacuum chamber stage 210. This is essentially two opposed mirror images.

A radiation source 201 can have a high conductance manifold 203 arrayed around the interface with the base reference plate 206. This manifold is attached to a vacuum pump via large aperture tube 204. Ports 225 through the first reference plate 206 surround the area of interest for good conduction, but are not necessary in all applications. The annular air bearing 214 is separated from the vacuum chamber 223 by differentially pumped grooves and seal lands 211 which are serviced by tubes from the motion system. This pattern is repeated exactly on the opposite side of the vacuum chamber stage 210. This second set of air bearing lands and differentially pumped grooves bear on surface 216 which is the top of the second reference plate 209. The opportunity exists to make the air bearing land area 214 smaller because in this embodiment the opposite pressures in the air bearing lands, grooves and chamber are exactly equal due to the fact that they are ported through common connections 217, 218, 220 and 221 to their source through 250, 251, 252 and 253. The pressurized air gaps 215 are preloaded against each other only. The air bearing 214 running on the second reference base 209 will be carrying the gravity load of the vacuum chamber stage 210 which would likely be 20 lbs. plus or minus an order of magnitude. The preload force between the bearings can easily be 10 times (one order of magnitude more than this gravity force), making the gravity force inconsequential. This allows the VCS to operate in a vacuum with the lowest pressure inside the VCS and isolated from contamination or pressure.

Figure 3A:
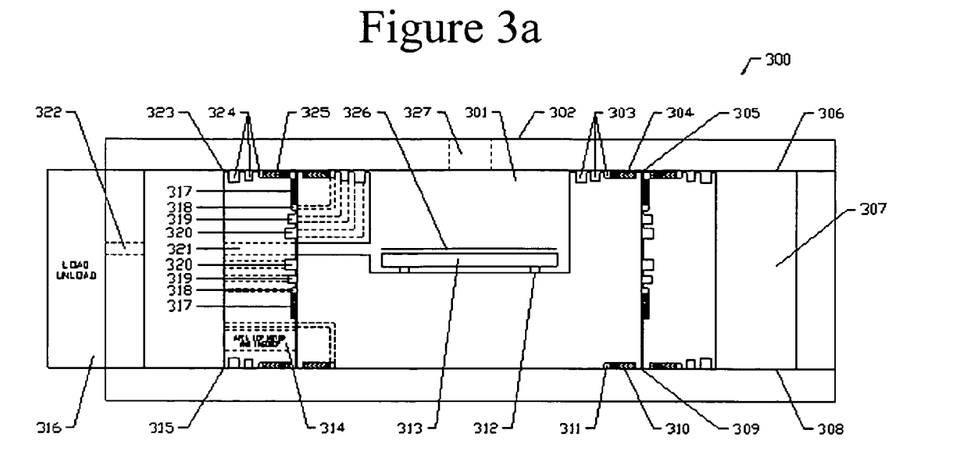
FIGS. 3a and 3b show a third preferred embodiment.
Figure 3B:
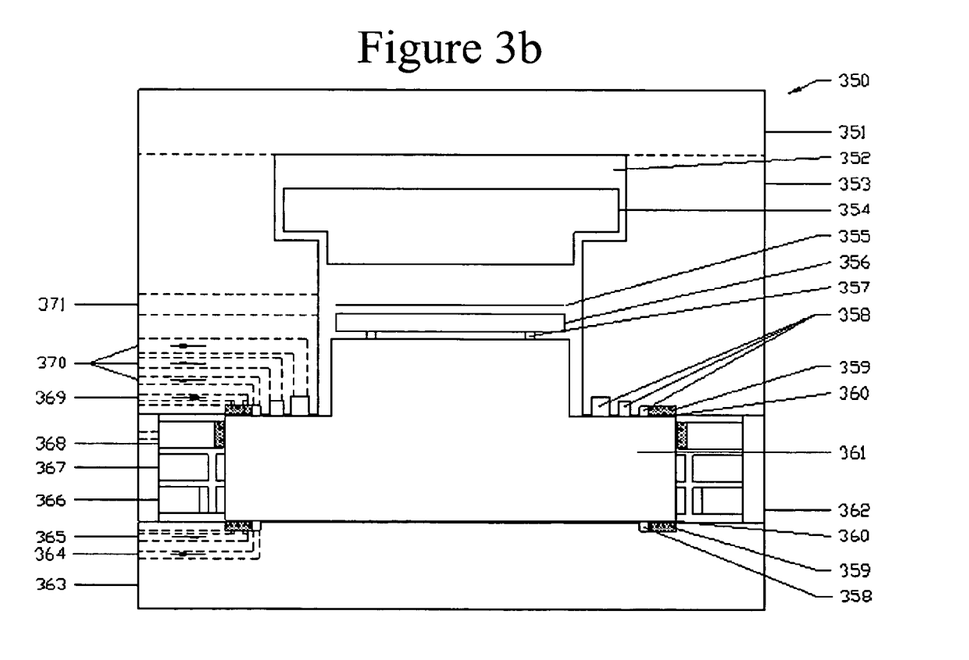

FIGS. 3a and 3b are sectional views of an X and Y vacuum chamber stage with rotation, and a differentially pumped port for transfer of the wafers or substrates and or high conductance pumping port, as in a third preferred embodiment.

Some applications, like thin film characterization, often employ rotation of the wafer. The embodiment of FIGS. 3a and 3b provides for rotation inside of an XY stage. By employing annular 360 degree radial air bearing surfaces isolated from the pass though by 360 degree radial differential pumped grooves and lands. As the XY stage is moved about, the radial bearings keep the rotating part centered. The XY stage carries a rotary actuator to spin the rotation part of the stage; it is possible to add an encoder. It is possible with differentially pumped grooves on outside of these bearings to operate the whole assembly in a vacuum environment. It will be necessary to vent the volume that the upper and lower 3 bearing set commonly leak into, it will also be necessary to vent the area under the rotating member to avoid pressure build up. An area 314 is provided for the motor and the encoder.

Figure 4A:
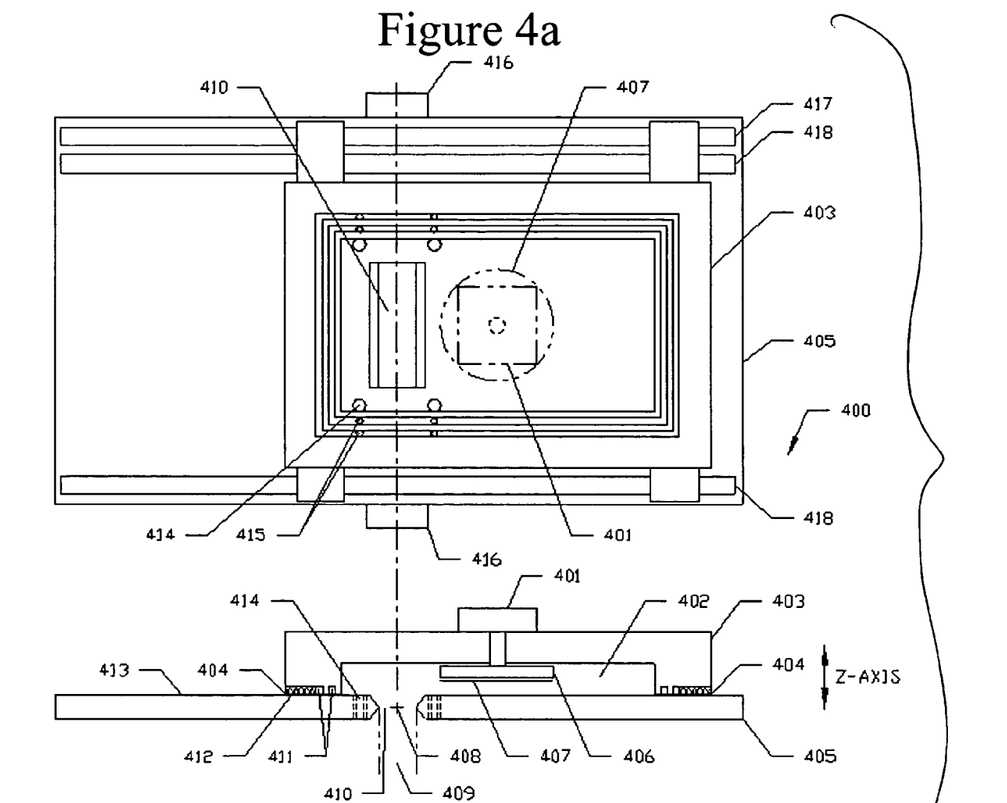
FIGS. 4a-4c show a fourth preferred embodiment.
Figure 4B:
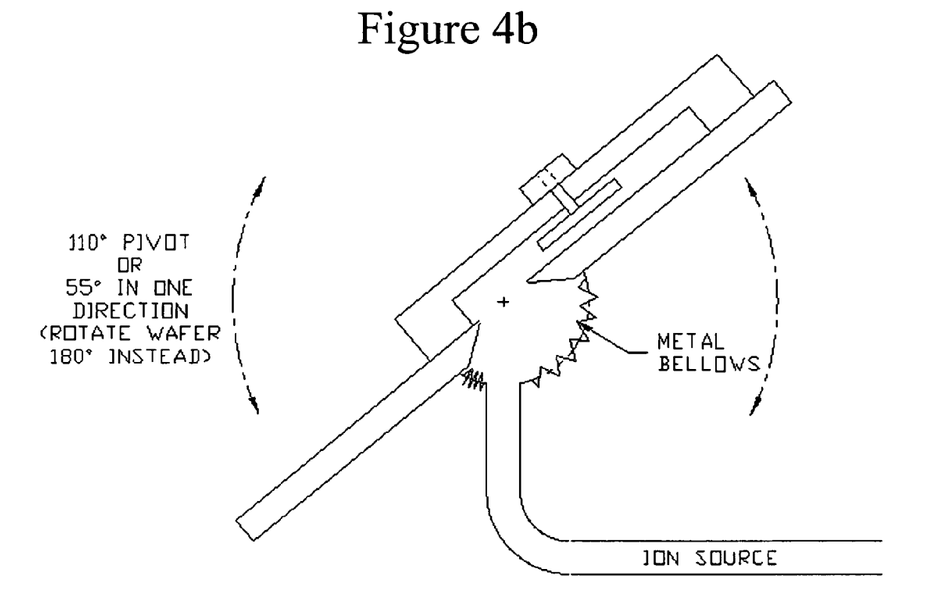
Figure 4C:
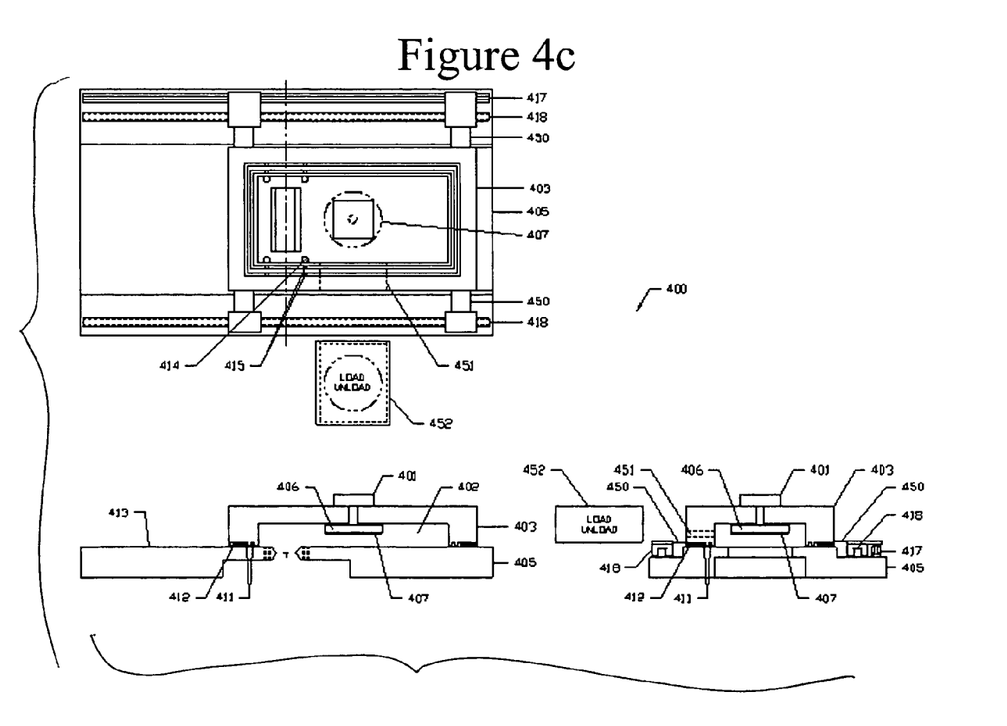

FIG. 4 a, b, c show a device and method for ion implantation of substrates such a semiconductor wafers as in a fourth preferred embodiment. Ion implantation has moved from batch processing to serial processing. Serial processing provides more flexibility in the recipe that is administered to each wafer and more flexibility in the attitude of the wafer to the ion radiation, being able to pitch and rotate the wafer so as to dope or expose the sides of the via and the trenches equally. In order to keep throughput high, makers of ion implantation equipment have been migrating from spot or point beams that were scanned across the wafer in batch process to "ribbon" type beams. Ribbon type beams are slightly wider than the substrate or wafer being processed. The substrate may then be passed through the ribbon beam, exposing the whole substrate surface to the radiation. The beam may be a thin ribbon; 0.25 in, or a thick ribbon; 4 in. The thickness of the ribbon beam has an effect on the required travel of the wafer, which must pass though the entire ribbon before reversal.

FIG. 4a represents the preferred embodiment of the vacuum chamber stage device and method for modern ion implantation. The beam 409 in this case comes from below with the first reference plate 405 and vacuum chamber stage 403 nominally horizontal, although this could easily be reversed or at 45 degrees. The vacuum chamber stage 403, as in previous embodiments is urged against the opposite side 413 of the first reference plate 405 from the radiation source by atmospheric pressure The vacuum chamber stage 403 is actuated by a motion system 417 outside of the vacuum area 402. The guidance for the motion system 418 could be from air bearings or rolling element bearings. In ion implantation motion characteristics are not as critical as in other precision applications and roller bearings would be an appropriate choice. The connection between the vacuum chamber stage 403 and the motion system 417 and actuators 418 could be with a blade flexure 450 which would decouple the vacuum chamber stage 403 from the drive and guide system in the Z direction which is constrained by the air bearing and atmospheric pressure against the vacuum chamber stage as in FIG. 4c. In this embodiment is not necessary to run vacuum services to the vacuum chamber stage 403. Because the motion on the vacuum chamber stage is linear only with respect to the base reference plate 405, holes or ports 415 through the first reference plate which aligned to the grooves 411 can be used to conduct pressure out of the grooves 411. Holes or ports 414 through the first reference plate 405 may also be used to conduct pressure from the chamber directly around the area of interest. These holes may be on an angle to clear the beam 409 during tilting. The chuck 406 holding the substrate or wafer 407 is mounted to a rotary actuator 401 through a Ferro fluidic, mechanical contact seal or air bearing with differentially pumped grooves. Continuous rotation is not required in this embodiment, only the ability to index 90 or 180 degrees, 90° in order to be able to get all the orthogonal groves and trenches, and 180 degrees in order to avoid tilting the plate in both directions as shown in FIG. 4b. Notice the whole reference plate may be tilted with respect to the Ion or radiation source. This tilting action, combined with a rotary motion allows complete coverage of all surfaces on the substrate including the sides of the via and trenches. This embodiment also allows for constant focus or distance from the Ion or radiation source providing the most uniform doping of the substrate.

Figure 5A:
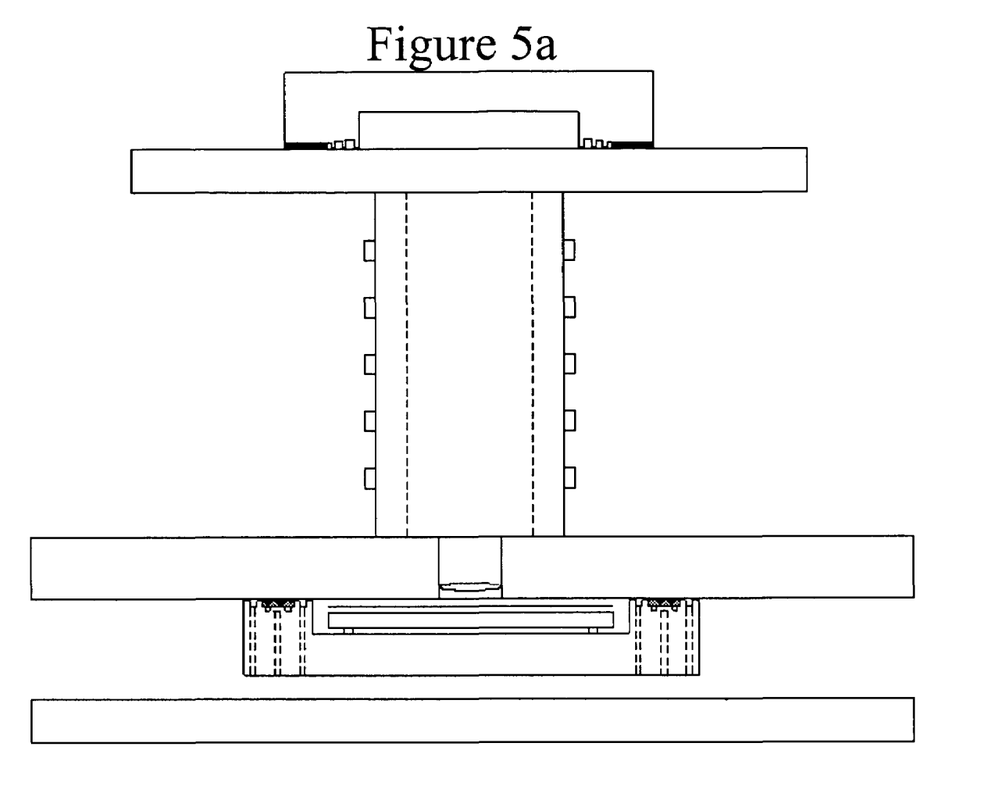
FIGS. 5a-5c show other preferred embodiments.
Figure 5B:
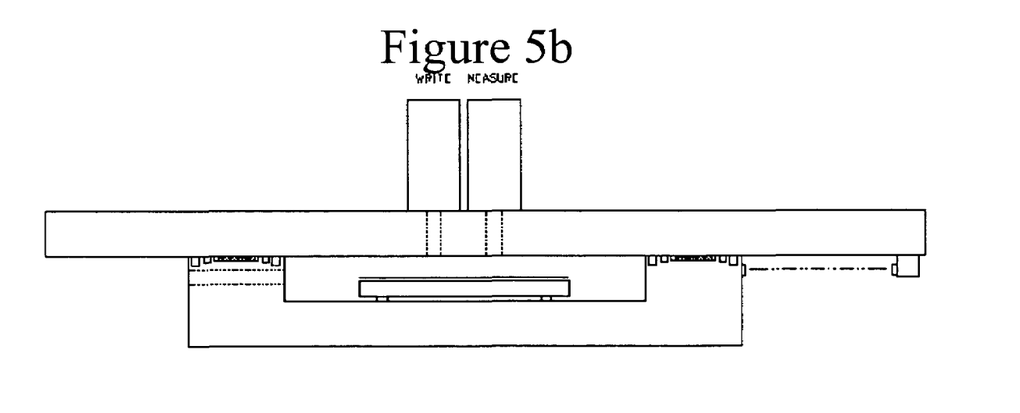
Figure 5C:
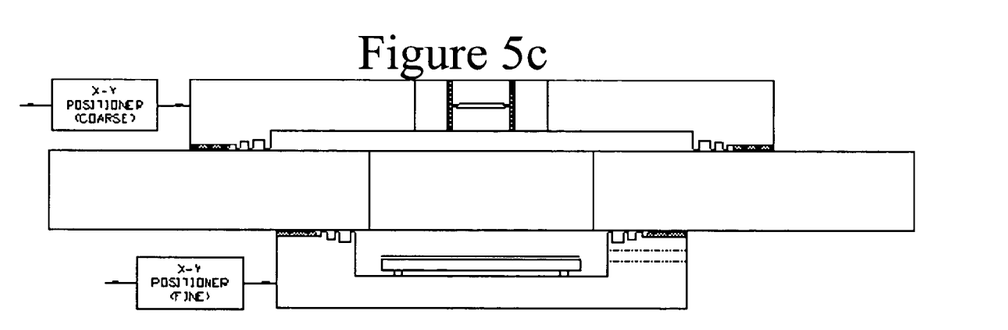

Still further embodiments are possible, as will be described with reference to FIGS. 5a-5c. FIG. 5a shows two VCS's on reference members on opposite sides of a cylindrical member. FIG. 5b shows a VCS on a reference member incorporating components for writing and measuring a workpiece. FIG. 5c shows two VCS's on opposite sides of an opening in a single reference member.

While preferred embodiments have been set forth in detail above, those skilled in the art who have reviewed the present disclosure will readily appreciate that other embodiments can be realized within the scope of the invention. For example, the invention can be used in a variety of applications other than those set forth in detail, such as display screens and MEMS. Therefore, the present invention should be construed as limited only by the appended claims.

I claim:

1. An apparatus for forming a vacuum chamber in which an object is placed, the apparatus comprising:
    a first reference member having a first reference surface defined thereon;
    one or more main stages that move on the first reference surface, each of the one or more main stages having a recessed pocket formed therein; and
    a combination fluid and vacuum bearing on each main stage that permits motion of the main stage over the reference surface and surrounds the recessed pocket in a manner that provides for a vacuum in the recessed pocket, thus forming the vacuum chamber.

2. An apparatus as in claim 1, further comprising an outer wall, and wherein the combination fluid and vacuum bearing has vacuum grooves that are progressively larger towards the recessed pocket that are connected to ports though the stage to an outer wall and used for differential pumping to obtain high vacuum in the recessed pocket.

3. An apparatus as in claim 1, wherein the combination fluid and vacuum bearing uses a gas as the fluid.

4. An apparatus as in claim 1, wherein the first reference member has vacuum channels formed therein, the vacuum channels having openings in the first reference surface, and wherein pumping of the vacuum in the recessed pocket is done through the openings of the vacuum channels in the first reference surface.

5. An apparatus as in claim 1, further comprising a second reference member having a second reference surface defined thereon so as to be parallel to the first reference surface and on the opposite side of one or more of the main stages, and wherein said one or more of the main stages are also supported by the second reference surface.

6. An apparatus as in claim 5, further comprising a sealed wall for enclosing the volume between the first reference surface and the second reference surface, and wherein the volume is partially pumped out or filled with clean dry air or filled with a non-reactive gas to control at least one of ambient pressure and contamination.

7. An apparatus as in claim 1, further comprising a Z positioner for moving the object in a direction normal to the first reference surface or to adjust the top surface of the object to be parallel to the first reference surface.

8. An apparatus as in claim 1, where a slot is provided in one side of one or more of the main stages to permit loading and unloading of the object.

9. An apparatus as in claim 1, further comprising an X-Y positioner for moving one or more of the main stages in X and Y axes parallel to the first reference surface, or in rotation about an axis normal to the first reference surface, or in any combination of these axes.

10. An apparatus as in claim 1, further comprising reaction masses for reduction of induced vibration.

11. An apparatus as in claim 1, further comprising a radiation source, and wherein the first reference surface supports the radiation source and includes an opening or window that transmits the radiation through the reference surface.

12. An apparatus as in claim 11, where the radiation source is an electron beam column, ion beam column, ion source, optical beam, laser beam, x-ray beam, deep ultraviolet beam, extreme ultraviolet beam, ultraviolet beam, or a combination thereof.

13. An apparatus as in claim 11, wherein the first reference surface is tiltable relative to a direction of radiation from the radiation source to change the angle between the radiation source and the object.

14. An apparatus as in claim 1, further comprising an added service stage that supports cables and hoses.

15. An apparatus as in claim 1, wherein the recessed pocket is filled with water or other high index fluid, and the combination fluid bearing operates using water or other high index fluid and vacuum.

16. An apparatus as in claim 15, wherein the water is at a pressure below atmospheric pressure.

17. An apparatus as in claim 15, wherein the combination fluid bearing operates using water or other high index fluid and gas and vacuum.

18. An apparatus as in claim 1, wherein the combination fluid and vacuum bearing has one or more porous surfaces.

19. An apparatus as in claim 18, wherein the one or more porous surfaces comprise graphite carbon, ceramic or silicon carbide.

20. An apparatus as in claim 1, wherein the combination fluid and vacuum bearing employs bearing compensation.

21. An apparatus as in claim 20, wherein the combination fluid and vacuum bearing employs orifice, step, shelf, or capillary compensation in the bearing.

22. A method of processing and observing or inspecting an object, the method comprising:
(a) providing an apparatus for forming a vacuum chamber in which the object is placed, the apparatus comprising:
a first reference member having a first reference surface defined thereon;
one or more main stages that move on the first reference surface, each of the one or more main stages having a recessed pocket formed therein; and
a combination fluid and vacuum bearing on each main stage that permits motion of the main stage over the reference surface and surrounds the recessed pocket in a manner that provides for a vacuum in the recessed pocket, thus forming the vacuum chamber;
(b) placing the object in the vacuum chamber; and
(c) processing and observing or inspecting the object in the vacuum chamber.

23. A method as in claim 22, wherein step (c) is performed with a radiation source.

24. A method as in claim 23, wherein the first reference surface is tilted relative to a direction of radiation from the radiation source to change the angle between the radiation source and the object.

25. A method as in claim 23, wherein the radiation source is an electron beam, or an ion beam, or an optical beam, a laser beam, x-ray beam, deep ultraviolet beam, extreme ultraviolet beam, ultraviolet beam, or a combination thereof.

26. A method as in claim 22, wherein step (a) comprises using a gas as the fluid in the combination fluid and vacuum bearing.

27. A method as in claim 22, wherein step (a) comprises using water or other high index fluid as the fluid in the combination fluid and vacuum or low pressure water bearing.

28. A method as in claim 27, wherein the recessed pocket is filled with the water or other high index fluid.

29. A method as in claim 22, where the combination fluid and vacuum bearing has vacuum grooves that are progressively larger towards the recessed pocket and use differential pumping to obtain high vacuum in the recessed pocket.

30. A method as in claim 22, wherein the object is a silicon wafer or mask.

31. A method as in claim 30, further comprising moving the object in a direction normal to the first reference surface.

32. A method as in claim 31, wherein the object is moved to adjust for a depth of field.

33. A method as in claim 31, wherein the object is moved to adjust for an error in thickness of the object.

34. A method as in claim 31, wherein the object is moved as part of replacing the object.

35. A method as in claim 22, further comprising moving the object in a direction normal to the first reference surface.

* * * * *